United States Patent
Lambert et al.

(10) Patent No.: US 11,348,620 B1
(45) Date of Patent: May 31, 2022

(54) SYSTEMS AND METHODS FOR POWER PROTECTION ON FAILED MEMORY DEVICES

(71) Applicant: Dell Products L.P., Round Rock, TX (US)

(72) Inventors: Timothy M. Lambert, Austin, TX (US); Jordan Chin, Austin, TX (US); Nihit S. Bhavsar, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 17/158,482

(22) Filed: Jan. 26, 2021

(51) Int. Cl.
*G11C 5/14* (2006.01)
*G06F 11/30* (2006.01)

(52) U.S. Cl.
CPC .......... *G11C 5/143* (2013.01); *G06F 11/3037* (2013.01); *G06F 11/3062* (2013.01)

(58) Field of Classification Search
CPC ... G11C 5/143; G06F 11/3037; G06F 11/3062
See application file for complete search history.

(56) References Cited

U.S. PATENT DOCUMENTS

| 6,766,469 | B2 * | 7/2004 | Larson | G06F 11/1044 710/302 |
| 2005/0138465 | A1 * | 6/2005 | Depew | G06F 11/1044 714/5.11 |
| 2016/0004587 | A1 * | 1/2016 | Agrawal | G06F 3/0673 714/6.11 |
| 2018/0004591 | A1 * | 1/2018 | Volentine | G06F 11/073 |

\* cited by examiner

*Primary Examiner* — Ajay Ojha
(74) *Attorney, Agent, or Firm* — Jackson Walker L.L.P.

(57) ABSTRACT

An information handling system may include a memory comprising a plurality of memory modules, each memory module comprising a plurality of memory chips, a host system comprising a host system processor configured to, during a boot of the information handling system, execute a basic input/output system of the information handling system configured to monitor for one or more faults of one or more memory modules of the plurality of memory modules, and control circuitry. The control circuitry may be configured to, in response to the one or more faults, determine if, all of one or more memory modules associated with a power control signal of such one or more memory modules have experienced faults, and if all of the one or more memory modules associated with the power control signal have experienced faults, de-assert the power control signal such that the one or more memory modules are de-energized.

30 Claims, 3 Drawing Sheets

SYSTEMS AND METHODS FOR POWER PROTECTION ON FAILED MEMORY DEVICES

TECHNICAL FIELD

The present disclosure relates in general to information handling systems, and more particularly to methods and systems for providing power protection on failed memory devices within an information handling system.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

An information handling system may use memory devices to store instructions and data for access by a processor in order to carry out functionality of the information handling system. Memory in an information handling system may include, for example, a plurality of dual-inline memory modules (DIMMs), each DIMM comprising a plurality of memory chips capable of storing data and instructions. A memory chip may include, for example, a dynamic random access memory (DRAM).

In many traditional memory architectures and implementations, an information handling system had limited control over power delivered to individual memory modules. In such approaches, when a memory chip of a memory module failed, such memory chip was mapped out from total system memory, but the amount of power consumed by the memory module remained in perpetuity until the memory module was removed or replaced.

With large memory footprints in modern information handling systems and redundancy modes such as memory mirroring, the time from failure of a memory module to a service action may be a significant amount of time. A bad memory chip may not indicate only a bad memory cell, as the failure mode could lead over time to a power fault observed by a power management integrated circuit (PMIC) of the memory module that must be contained to protect the information handling system and other memory modules within a group of memory modules from electrical damage.

A failure mode can comprise an overvoltage, an undervoltage, an electrostatic discharge failure, and others, that can affect an entirety of an information handling system resulting in a power fault that may take down an information handling system and negatively affect uptime. Such a failure may also increase cold and warm boot times because upon discovery of a bad memory chip, the information handling system may poll PMIC registers and explicitly disable the bad memory chip.

SUMMARY

In accordance with the teachings of the present disclosure, the disadvantages and problems associated with failures in memory devices of an information handling system may be reduced or eliminated.

In accordance with embodiments of the present disclosure, an information handling system may include a memory comprising a plurality of memory modules, each memory module comprising a plurality of memory chips, a host system comprising a host system processor configured to, during a boot of the information handling system, execute a basic input/output system of the information handling system configured to monitor for one or more faults of one or more memory modules of the plurality of memory modules, and control circuitry. The control circuitry may be configured to, in response to the one or more faults, determine if, all of one or more memory modules associated with a power control signal of such one or more memory modules have experienced faults, and if all of the one or more memory modules associated with the power control signal have experienced faults, de-assert the power control signal such that the one or more memory modules are de-energized.

In accordance with these and other embodiments of the present disclosure, a method may be provided in an information handling system comprising a memory having a plurality of memory modules, and each memory module comprising a plurality of memory chips. The method may include during a boot of the information handling system, executing a basic input/output system of the information handling system configured to monitor for one or more faults of one or more memory module of the plurality of memory modules. The method may also include, in response to the one or more faults, determine if, all of one or more memory modules associated with a power control signal of such one or more memory modules have experienced faults. The method may further include, if all of the one or more memory modules associated with the power control signal have experienced faults, de-assert the power control signal such that the one or more memory modules are de-energized.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
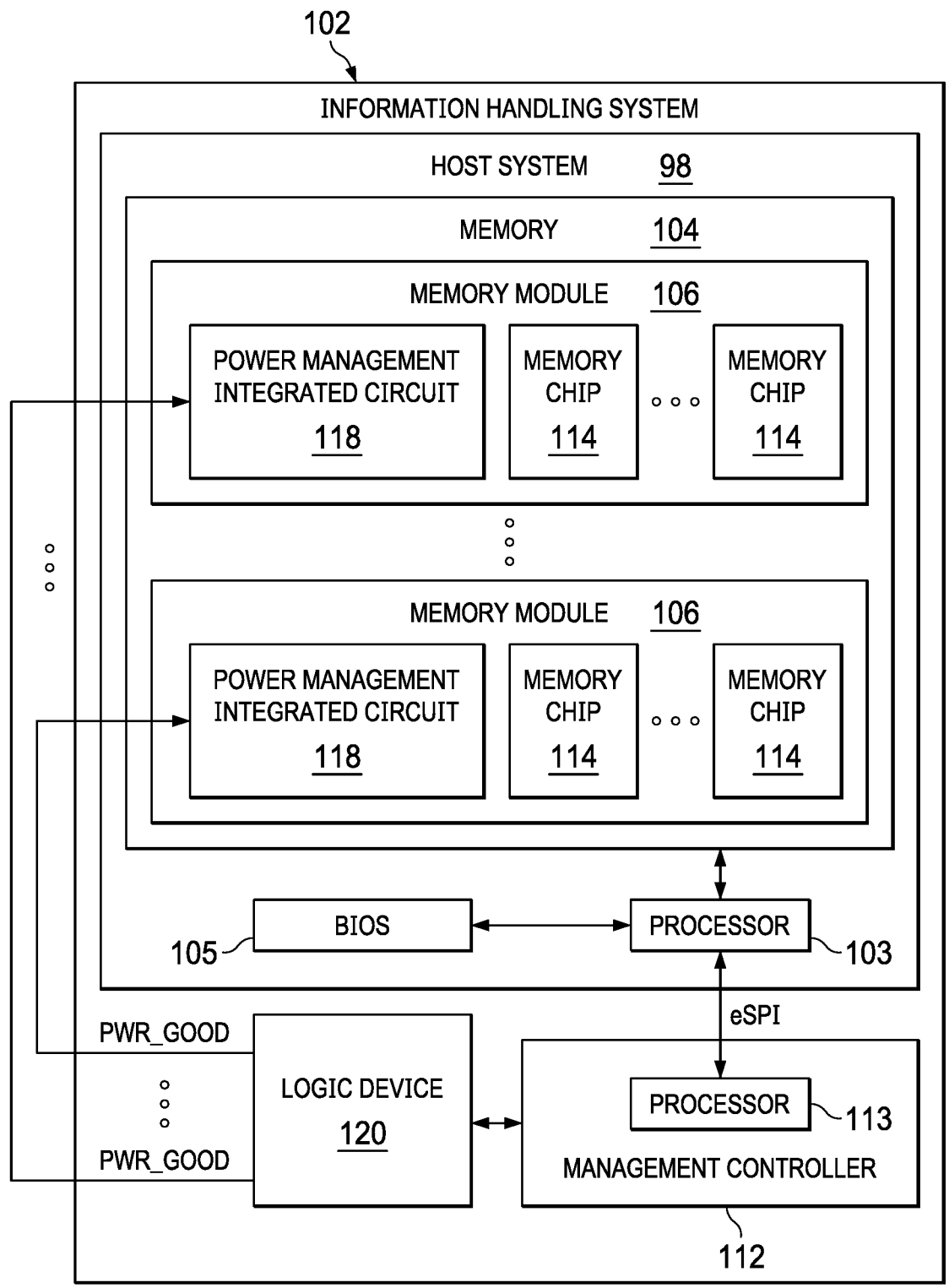
FIG. 1 illustrates a block diagram of an example information handling system, in accordance with embodiments of the present disclosure.
Figure 2:
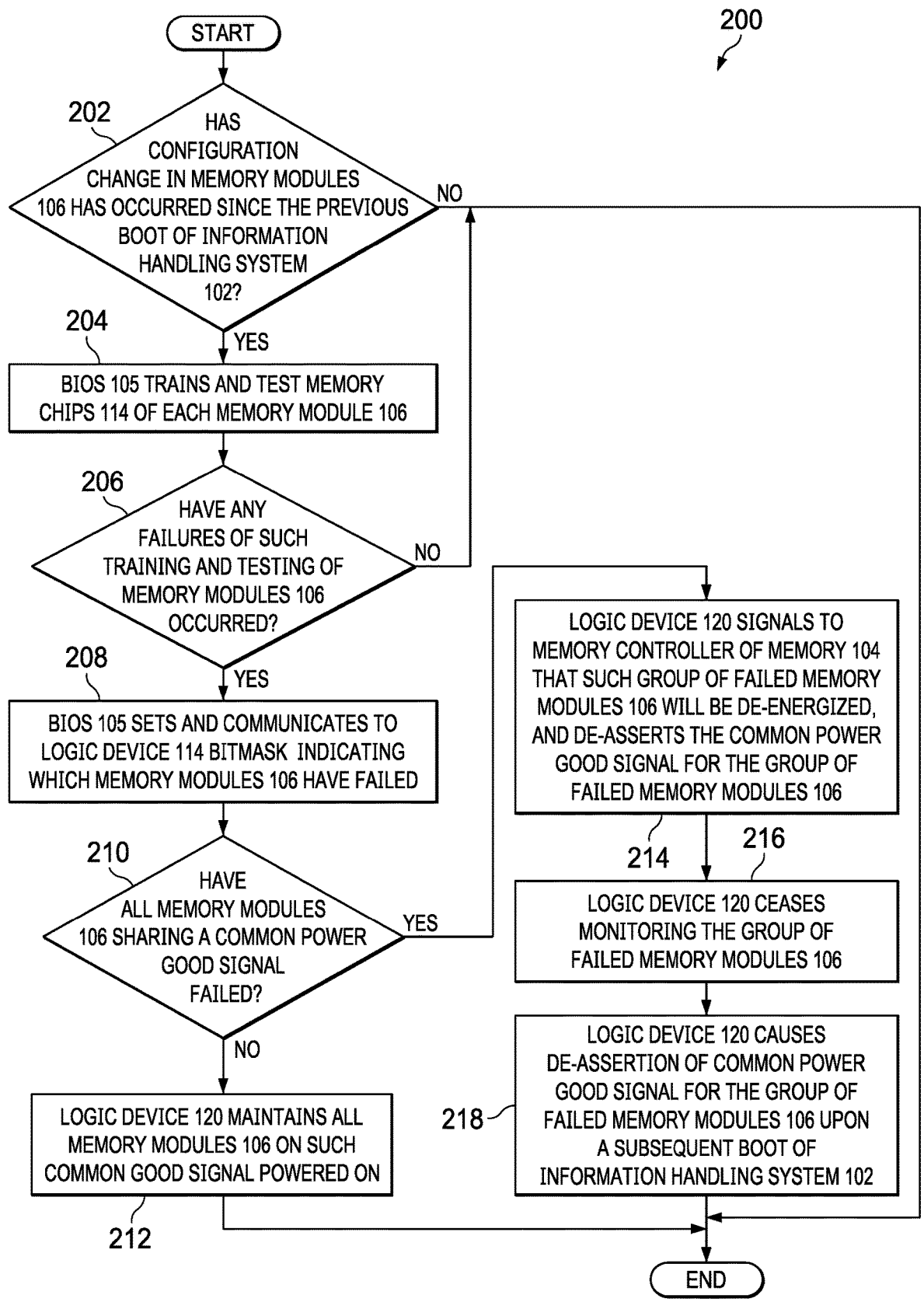
FIG. 2 illustrates a flow chart of an example method for power protection on failed memory devices, in accordance with embodiments of the present disclosure.

Preferred embodiments and their advantages are best understood by reference to FIGS. 1 and 2, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal digital assistant (PDA), a consumer electronic device, a network storage device, or any other suitable device and may vary in size, shape, performance, functionality, and price. The information handling system may include memory, one or more processing resources such as a central processing unit ("CPU") or hardware or software control logic. Additional components of the information handling system may include one or more storage devices, one or more communications ports for communicating with external devices as well as various input/output ("I/O") devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, service processors, basic input/output systems, buses, memories, I/O devices and/or interfaces, storage resources, network interfaces, motherboards, and/or any other components and/or elements of an information handling system.

FIG. 1 illustrates a block diagram of an example information handling system 102, in accordance with embodiments of the present disclosure. In some embodiments, information handling system 102 may comprise a personal computer. In some embodiments, information handling system 102 may comprise or be an integral part of a server. In other embodiments, information handling system 102 may comprise a portable information handling system (e.g., a laptop, notebook, tablet, handheld, smart phone, personal digital assistant, etc.). As depicted in FIG. 1, information handling system 102 may include a processor 103, a memory 104 communicatively coupled to processor 103, a basic input/output system (BIOS) 105 communicatively coupled to processor 103, a management controller 112 communicatively coupled to processor 103, and a logic device 120 communicatively coupled to processor 103 and management controller 112. In operation, processor 103, memory 104, and BIOS 105 may comprise at least a portion of a host system 98 of information handling system 102.

Processor 103 may include any system, device, or apparatus configured to interpret and/or execute program instructions and/or process data, and may include, without limitation, a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored in memory 104 and/or another component of information handling system 102.

Memory 104 may be communicatively coupled to processor 103 and may include any system, device, or apparatus configured to retain program instructions and/or data for a period of time (e.g., computer-readable media). Memory 104 may include RAM, EEPROM, a PCMCIA card, flash memory, magnetic storage, opto-magnetic storage, or any suitable selection and/or array of volatile or non-volatile memory that retains data after power to information handling system 102 is turned off.

As shown in FIG. 1, memory 104 may comprise a plurality of memory modules 106. Each memory module 106 may include any system, device or apparatus configured to retain program instructions and/or data for a period of time (e.g., computer-readable media). A memory module 106 may comprise a dual in-line package (DIP) memory, a dual-inline memory module (DIMM), a Single In-line Pin Package (SIPP) memory, a Single Inline Memory Module (SIMM), a Ball Grid Array (BGA), or any other suitable memory module. In some embodiments, memory modules 106 may comprise double data rate (DDR) memory. As shown in FIG. 1, each memory module 106 may comprise a plurality of memory chips 114 and a power management integrated circuit (PMIC) 118.

Each memory chip 114 may include one or more dies for storing data. In some embodiments, a memory chip 114 may include one or more dynamic random access memory (DRAM) dies. In other embodiments, a memory chip 114 die may comprise flash, Spin-Transfer Torque Magnetoresistive RAM (STT-MRAM), Phase Change Memory (PCM), ferro-electric memory, memristor memory, or any other suitable memory device technology.

A PMIC 118 may include any suitable system, device, or apparatus configured to perform power conversion (e.g., direct-current-to-direct-current power conversion), power distribution, power control, voltage regulation, and/or power monitoring and reporting for a memory module 106 and its memory chips 114 and other components.

BIOS 105 may be communicatively coupled to processor 103 and may include any system, device, or apparatus configured to identify, test, and/or initialize information handling resources of information handling system 102. "BIOS" may broadly refer to any system, device, or apparatus configured to perform such functionality, including without limitation, a Unified Extensible Firmware Interface (UEFI). In some embodiments, BIOS 105 may be implemented as a program of instructions that may be stored on a read-only memory of information handling system 102 and which may be read by and executed on processor 103 to carry out the functionality of BIOS 105. In these and other embodiments, BIOS 105 may comprise boot firmware configured to be the first code executed by processor 103 when information handling system 102 is booted and/or powered on. As part of its initialization functionality, code for BIOS 105 may be configured to set components of information handling system 102 into a known state, so that one or more applications (e.g., an operating system or other application programs) stored on compatible media (e.g., memory 104) may be executed by processor 103 and given control of information handling system 102.

Management controller 112 may be configured to provide management facilities for management of information handling system 102. Such management may be made by management controller 112 even if information handling system 102 is powered off or powered to a standby state.

Management controller 112 may include a processor 113 communicatively coupled to processor 103. Processor 113 may include any system, device, or apparatus configured to interpret and/or execute program instructions and/or process data, and may include, without limitation, a microprocessor, microcontroller, digital signal processor (DSP), application specific integrated circuit (ASIC), or any other digital or analog circuitry configured to interpret and/or execute program instructions and/or process data. In some embodiments, processor 113 may interpret and/or execute program instructions and/or process data stored in computer-readable media of information handling system 102 or management controller 112. As shown in FIG. 1, processor 113 may be communicatively coupled to processor 103. Such coupling may be via a Universal Serial Bus (USB), System Management Bus (SMBus), general purpose input/output (GPIO) channel and/or one or more other communications channels.

A logic device 120 may comprise any suitable system, device, or apparatus that may perform a specialized function that extends the functionality of information handling system 102. For example, logic device 120 may comprise a complex programmable logic device (CPLD) or field-programmable gate array (FPGA).

In operation, as described in more detail below, processor 103 in concert with BIOS 105, management controller 112 and logic device 120, may be configured to, upon detection of a failed memory chip 114, conditionally disable a PMIC 118 of the memory module 106 (e.g., by deasserting a "power good" control signal) comprising the failed memory chip 114. An algorithm performed by processor 103, management controller 112 and logic device 120 may consider whether a memory module 106 has a memory chip 114 with a bad memory cell or, if the failure is due to signal integrity, may consider a number of memory modules 106 per memory channel, and if all memory slots in a "power good" signal group are missing or failed, in order to determine an optimum combination of PMICs 118 to disable.

Although FIG. 1 depicts each memory module 106 having its own dedicated power good signal, in some embodiments, a power good signal may be shared by two or more memory modules 106, or in some cases, by all memory modules 106.

FIG. 2 illustrates a flow chart of an example method 200 for power protection on failed memory devices, in accordance with embodiments of the present disclosure. According to some embodiments, method 200 may begin at step 202. As noted above, teachings of the present disclosure may be implemented in a variety of configurations of information handling system 102. As such, the preferred initialization point for method 200 and the order of the steps comprising method 200 may depend on the implementation chosen.

At step 202, BIOS 105, executing on processor 103 may, upon boot of information handling system 102, determine from configuration settings of BIOS 105 whether or not a configuration change in memory modules 106 has occurred since the previous boot of information handling system 102. If a configuration change in memory modules 106 has occurred, method 200 may proceed to step 204. Otherwise, method 200 may end.

At step 204, BIOS 105 may train and test memory chips 114 of each memory module 106. At step 206, BIOS 105 may determine if any failures of such training and testing of memory modules 106 has occurred. If any failures of such training and testing of memory modules 106 have occurred, method 200 may proceed to step 208. Otherwise, method 200 may end.

At step 208, BIOS 105 may set and communicate to logic device 114 a bitmask indicating which memory modules 106 have failed. At step 210, logic device 120 may determine if all memory modules 106 sharing a common power good signal have failed. If all memory modules 106 sharing a common power good signal have failed, method 200 may proceed to step 214. Otherwise, method 200 may proceed to step 212.

At step 212, responsive to a memory module failure such that a common power good signal is shared among failed and non-failed memory modules 106, logic device 120 may maintain all memory modules 106 on such common good signal powered on, despite the failed memory modules on the common good signal. After completion of step 212, method 200 may end.

At step 214, responsive to a memory module failure such that a common power good signal is shared among only failed memory modules 106, logic device 120 may signal to a memory controller of memory 104 that such group of failed memory modules 106 will be de-energized, and may de-assert the common power good signal for the group of failed memory modules 106. At step 216, logic device 120 may cease monitoring the group of failed memory modules 106. At step 218, logic device 120 may set necessary configuration parameters such that logic device 120 de-asserts the common power good signal for the group of failed memory modules 106 upon a subsequent boot of information handling system 102 (e.g., provided no change in memory configuration occurs prior to the subsequent boot). After completion of step 218, method 200 may end.

Although FIG. 2 discloses a particular number of steps to be taken with respect to method 200, method 200 may be executed with greater or fewer steps than those depicted in FIG. 2. In addition, although FIG. 2 discloses a certain order of steps to be taken with respect to method 200, the steps comprising method 200 may be completed in any suitable order.

Method 200 may be implemented using information handling system 102 or any other system operable to implement method 200. In certain embodiments, method 200 may be implemented partially or fully in software and/or firmware embodied in computer-readable media.

Figure 3:
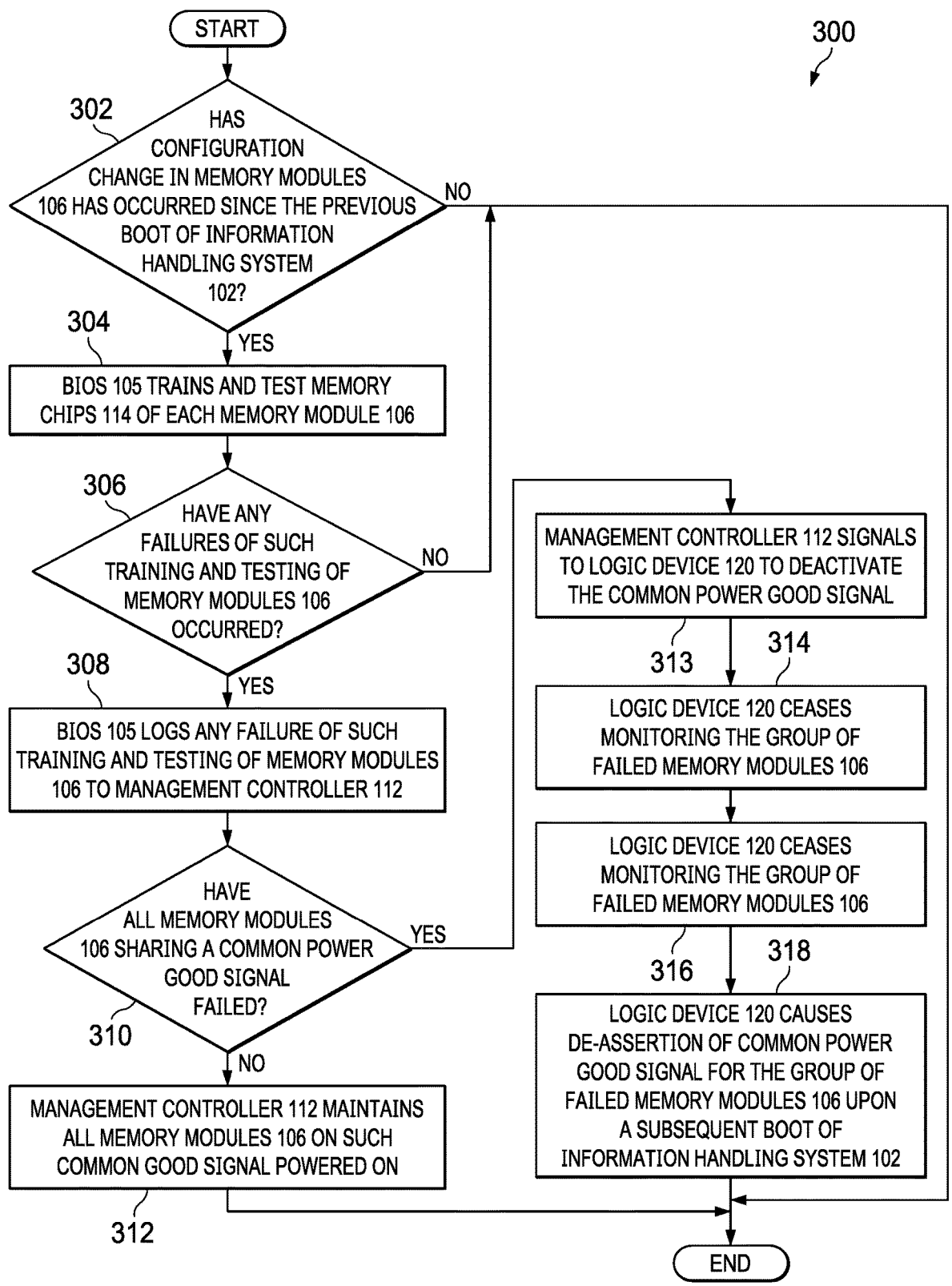
FIG. 3 illustrates a flow chart of another example method for power protection on failed memory devices, in accordance with embodiments of the present disclosure.

FIG. 3 illustrates a flow chart of another example method 300 for power protection on failed memory devices, in accordance with embodiments of the present disclosure. According to some embodiments, method 300 may begin at step 302. As noted above, teachings of the present disclosure may be implemented in a variety of configurations of information handling system 102. As such, the preferred initialization point for method 300 and the order of the steps comprising method 300 may depend on the implementation chosen.

At step 302, BIOS 105, executing on processor 103 may, upon boot of information handling system 102, determine from configuration settings of BIOS 105 whether or not a configuration change in memory modules 106 has occurred since the previous boot of information handling system 102. If a configuration change in memory modules 106 has occurred, method 300 may proceed to step 304. Otherwise, method 300 may end.

At step 304, BIOS 105 may train and test memory chips 114 of each memory module 106. At step 306, BIOS 105 may determine if any failures of such training and testing of memory modules 106 has occurred. If any failures of such training and testing of memory modules 106 have occurred, method 300 may proceed to step 308. Otherwise, method 300 may end.

At step 308, BIOS 105 may log any failure of such training and testing of memory modules 106 to management controller 112. At step 310, management controller may determine if all memory modules 106 sharing a common power good signal have failed. If all memory modules 106 sharing a common power good signal have failed, method 300 may proceed to step 313. Otherwise, method 300 may proceed to step 312.

At step 312, responsive to a memory module failure such that a common power good signal is shared among failed and non-failed memory modules 106, management controller 112 may maintain all memory modules 106 on such common good signal powered on, despite the failed memory modules on the common good signal. After completion of step 312, method 300 may end.

At step 313, responsive to a memory module failure such that a common power good signal is shared among only failed memory modules 106, management controller 112 may signal to logic device 120 to deactivate the common power good signal. At step 314, logic device 120 may signal to a memory controller of memory 104 that such group of failed memory modules 106 will be de-energized, and may de-assert the common power good signal for the group of failed memory modules 106. At step 316, logic device 120 may cease monitoring the group of failed memory modules 106. At step 318, logic device 120 may set necessary configuration parameters such that logic device 120 de-asserts the common power good signal for the group of failed memory modules 106 upon a subsequent boot of information handling system 102 (e.g., provided no change in memory configuration occurs prior to the subsequent boot). After completion of step 318, method 300 may end.

Although FIG. 3 discloses a particular number of steps to be taken with respect to method 300, method 300 may be executed with greater or fewer steps than those depicted in FIG. 3. In addition, although FIG. 3 discloses a certain order of steps to be taken with respect to method 300, the steps comprising method 300 may be completed in any suitable order.

Method 300 may be implemented using information handling system 102 or any other system operable to implement method 300. In certain embodiments, method 300 may be implemented partially or fully in software and/or firmware embodied in computer-readable media.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described above, the principles of the present disclosure may be implemented using any number of techniques, whether currently known or not. The present disclosure should in no way be limited to the exemplary implementations and techniques illustrated in the figures and described above.

Unless otherwise specifically noted, articles depicted in the figures are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:
1. An information handling system comprising:
  a memory comprising a plurality of memory modules, each memory module comprising a plurality of memory chips;

a host system comprising a host system processor configured to, during a boot of the information handling system, execute a basic input/output system of the information handling system configured to monitor for one or more faults of one or more memory modules of the plurality of memory modules; and control circuitry configured to:
in response to the one or more faults, determine if, all of one or more memory modules associated with a power control signal of such one or more memory modules have experienced faults;
if all of the one or more memory modules associated with the power control signal have experienced faults, de-assert the power control signal such that the one or more memory modules are de-energized; and
cease monitoring of all of the one or more memory modules associated with the power control signal if all of the one or more memory modules associated with the power control signal have experienced faults.

2. The information handling system of claim 1, wherein the basic input/output system is further configured to monitor for the one or more faults of the one or more memory modules of the plurality of memory modules only in response to a configuration change of the memory.

3. The information handling system of claim 1, wherein the control circuitry is further configured to de-assert the power control signal upon a subsequent boot of the information handling system such that the one or more memory modules are de-energized during such subsequent boot.

4. The information handling system of claim 1, wherein the control circuitry comprises a logic device communicatively coupled to the plurality of memory modules and configured to selectively assert and de-assert the power control signal.

5. The information handling system of claim 4, wherein the logic device is further configured to receive an indication from the basic input/output system of which of the plurality of memory modules have experienced the one or more faults.

6. The information handling system of claim 4, wherein the control circuitry further comprising a management controller communicatively coupled to the host system processor and the logic device and configured for performing out-of-band management of the information handling system, wherein the management controller is further configured to:
receive an indication from the basic input/output system of which of the plurality of memory modules have experienced the one or more faults; and
based on such indication, cause the logic device to de-assert the power control signal if all of the one or more memory modules associated with the power control signal have experienced faults.

7. A method comprising, in an information handling system comprising a memory having a plurality of memory modules, and each memory module comprising a plurality of memory chips:
during a boot of the information handling system, executing a basic input/output system of the information handling system configured to monitor for one or more faults of one or more memory module of the plurality of memory modules;
in response to the one or more faults, determine if, all of one or more memory modules associated with a power control signal of such one or more memory modules have experienced faults;
if all of the one or more memory modules associated with the power control signal have experienced faults, de-assert the power control signal such that the one or more memory modules are de-energized; and
ceasing monitoring of all of the one or more memory modules associated with the power control signal if all of the one or more memory modules associated with the power control signal have experienced faults.

8. The method of claim 7, further comprising monitoring, by the basic input/output system, for the one or more faults of the one or more memory modules of the plurality of memory modules only in response to a configuration change of the memory.

9. The method of claim 7, further comprising de-asserting the power control signal upon a subsequent boot of the information handling system such that the one or more memory modules are de-energized during such subsequent boot.

10. The method of claim 7, further comprising selectively asserting and de-asserting the power control signal with a logic device communicatively coupled to the plurality of memory modules.

11. The method of claim 10, further comprising the logic device receiving an indication from the basic input/output system of which of the plurality of memory modules have experienced the one or more faults.

12. The method of claim 10, further comprising:
receiving, by a management controller communicatively coupled to the host system processor and the logic device and configured for performing out-of-band management of the information handling system, an indication from the basic input/output system of which of the plurality of memory modules have experienced the one or more faults; and
based on such indication, causing, by the management controller, the logic device to de-assert the power control signal if all of the one or more memory modules associated with the power control signal have experienced faults.

13. An information handling system comprising:
a memory comprising a plurality of memory modules, each memory module comprising a plurality of memory chips;
a host system comprising a host system processor configured to, during a boot of the information handling system, execute a basic input/output system of the information handling system configured to monitor for one or more faults of one or more memory modules of the plurality of memory modules; and
control circuitry configured to:
in response to the one or more faults, determine if, all of one or more memory modules associated with a power control signal of such one or more memory modules have experienced faults;
if all of the one or more memory modules associated with the power control signal have experienced faults, de-assert the power control signal such that the one or more memory modules are de-energized; and
de-assert the power control signal upon a subsequent boot of the information handling system such that the one or more memory modules are de-energized during such subsequent boot.

14. The information handling system of claim 13, wherein the basic input/output system is further configured to monitor for the one or more faults of the one or more memory modules of the plurality of memory modules only in response to a configuration change of the memory.

15. The information handling system of claim 13, wherein the control circuitry comprises a logic device communicatively coupled to the plurality of memory modules and configured to selectively assert and de-assert the power control signal.

16. The information handling system of claim 15, wherein the logic device is further configured to receive an indication from the basic input/output system of which of the plurality of memory modules have experienced the one or more faults.

17. The information handling system of claim 15, wherein the control circuitry further comprising a management controller communicatively coupled to the host system processor and the logic device and configured for performing out-of-band management of the information handling system, wherein the management controller is further configured to:
   receive an indication from the basic input/output system of which of the plurality of memory modules have experienced the one or more faults; and
   based on such indication, cause the logic device to de-assert the power control signal if all of the one or more memory modules associated with the power control signal have experienced faults.

18. An information handling system comprising:
   a memory comprising a plurality of memory modules, each memory module comprising a plurality of memory chips;
   a host system comprising a host system processor configured to, during a boot of the information handling system, execute a basic input/output system of the information handling system configured to monitor for one or more faults of one or more memory modules of the plurality of memory modules; and
   control circuitry configured to:
      in response to the one or more faults, determine if, all of one or more memory modules associated with a power control signal of such one or more memory modules have experienced faults; and
      if all of the one or more memory modules associated with the power control signal have experienced faults, de-assert the power control signal such that the one or more memory modules are de-energized;
      wherein the control circuitry comprises a logic device communicatively coupled to the plurality of memory modules and configured to selectively assert and de-assert the power control signal.

19. The information handling system of claim 18, wherein the basic input/output system is further configured to monitor for the one or more faults of the one or more memory modules of the plurality of memory modules only in response to a configuration change of the memory.

20. The information handling system of claim 18, wherein the logic device is further configured to receive an indication from the basic input/output system of which of the plurality of memory modules have experienced the one or more faults.

21. The information handling system of claim 18, wherein the control circuitry further comprising a management controller communicatively coupled to the host system processor and the logic device and configured for performing out-of-band management of the information handling system, wherein the management controller is further configured to:
   receive an indication from the basic input/output system of which of the plurality of memory modules have experienced the one or more faults; and
   based on such indication, cause the logic device to de-assert the power control signal if all of the one or more memory modules associated with the power control signal have experienced faults.

22. A method comprising, in an information handling system comprising a memory having a plurality of memory modules, and each memory module comprising a plurality of memory chips;
   during a boot of the information handling system, executing a basic input/output system of the information handling system configured to monitor for one or more faults of one or more memory module of the plurality of memory modules;
   in response to the one or more faults, determine if, all of one or more memory modules associated with a power control signal of such one or more memory modules have experienced faults;
   if all of the one or more memory modules associated with the power control signal have experienced faults, de-assert the power control signal such that the one or more memory modules are de-energized; and
   de-asserting the power control signal upon a subsequent boot of the information handling system such that the one or more memory modules are de-energized during such subsequent boot.

23. The method of claim 22, further comprising monitoring, by the basic input/output system, for the one or more faults of the one or more memory modules of the plurality of memory modules only in response to a configuration change of the memory.

24. The method of claim 22, further comprising selectively asserting and de-asserting the power control signal with a logic device communicatively coupled to the plurality of memory modules.

25. The method of claim 24, further comprising the logic device receiving an indication from the basic input/output system of which of the plurality of memory modules have experienced the one or more faults.

26. The method of claim 24, further comprising:
   receiving, by a management controller communicatively coupled to the host system processor and the logic device and configured for performing out-of-band management of the information handling system, an indication from the basic input/output system of which of the plurality of memory modules have experienced the one or more faults; and
   based on such indication, causing, by the management controller, the logic device to de-assert the power control signal if all of the one or more memory modules associated with the power control signal have experienced faults.

27. A method comprising, in an information handling system comprising a memory having a plurality of memory modules, and each memory module comprising a plurality of memory chips;
   during a boot of the information handling system, executing a basic input/output system of the information handling system configured to monitor for one or more faults of one or more memory module of the plurality of memory modules;
   in response to the one or more faults, determine if, all of one or more memory modules associated with a power control signal of such one or more memory modules have experienced faults;

if all of the one or more memory modules associated with the power control signal have experienced faults, de-assert the power control signal such that the one or more memory modules are de-energized; and selectively asserting and de-asserting the power control signal with a logic device communicatively coupled to the plurality of memory modules.

28. The method of claim 27, further comprising monitoring, by the basic input/output system, for the one or more faults of the one or more memory modules of the plurality of memory modules only in response to a configuration change of the memory.

29. The method of claim 27, further comprising the logic device receiving an indication from the basic input/output system of which of the plurality of memory modules have experienced the one or more faults.

30. The method of claim 27, further comprising:
receiving, by a management controller communicatively coupled to the host system processor and the logic device and configured for performing out-of-band management of the information handling system, an indication from the basic input/output system of which of the plurality of memory modules have experienced the one or more faults; and based on such indication, causing, by the management controller, the logic device to de-assert the power control signal if all of the one or more memory modules associated with the power control signal have experienced faults.

* * * * *